(12) United States Patent
Ohtani

(10) Patent No.: US 10,165,684 B2
(45) Date of Patent: Dec. 25, 2018

(54) FLUID CONTROL APPARATUS

(71) Applicant: HORIBA STEC, Co., Ltd., Kyoto-shi, Kyoto (JP)

(72) Inventor: Katsuya Ohtani, Kyoto (JP)

(73) Assignee: HORIBA STEC, Co., Ltd., Kyoto-shi, Kyoto (JP)

(*) Notice: Subject to any disclaimer, the term of this patent is extended or adjusted under 35 U.S.C. 154(b) by 15 days.

(21) Appl. No.: 15/462,417

(22) Filed: Mar. 17, 2017

(65) Prior Publication Data
US 2017/0285666 A1   Oct. 5, 2017

(30) Foreign Application Priority Data
Mar. 29, 2016   (JP) .................. 2016-066609

(51) Int. Cl.
*H05K 1/14*  (2006.01)
*H05K 1/18*  (2006.01)
*H05K 3/36*  (2006.01)
*H01R 12/71*  (2011.01)
*H01R 12/50*  (2011.01)
(Continued)

(52) U.S. Cl.
CPC .............. *H05K 1/141* (2013.01); *H05K 1/181* (2013.01); *H05K 3/368* (2013.01); *H01R 12/712* (2013.01); *H01R 12/716* (2013.01); *H01R 12/732* (2013.01); *H01R 23/68* (2013.01); *H05K 1/117* (2013.01); *H05K 1/14* (2013.01); *H05K 1/142* (2013.01); *H05K 1/145* (2013.01); *H05K 2201/041* (2013.01); *H05K 2201/043* (2013.01); *H05K 2201/048* (2013.01); *H05K 2201/049* (2013.01); *H05K 2201/09072* (2013.01); *H05K 2201/09181* (2013.01);
(Continued)

(58) Field of Classification Search
CPC .......... H05K 1/14; H05K 1/141; H05K 1/142; H05K 1/145; H05K 1/144; H05K 2201/041; H05K 2201/042; H05K 2201/043; H01R 12/732; H01R 12/712; H01R 23/68
USPC .................. 361/784, 785, 786, 790, 792, 80
See application file for complete search history.

(56) References Cited

U.S. PATENT DOCUMENTS

| | | | | |
|---|---|---|---|---|
| 4,631,820 A | * | 12/1986 | Harada | ................. H05K 1/141 174/254 |
| 2013/0269795 A1 | * | 10/2013 | Yasuda | ............... G05D 7/0106 137/488 |
| 2016/0353530 A1 | * | 12/2016 | Matsuda | ............ H01L 27/3293 |

FOREIGN PATENT DOCUMENTS

JP     2016021219 A     2/2016

* cited by examiner

*Primary Examiner* — Binh Tran
(74) *Attorney, Agent, or Firm* — Alleman Hall Creasman & Tuttle LLP

(57) ABSTRACT

A fluid control apparatus is provided which makes it possible to effortlessly perform cable connection even when a plurality of the fluid control apparatuses are disposed adjacent to each other. The fluid control apparatus includes fluid control units to control a flow rate or pressure of a fluid, an electric circuit board to send and receive a signal to and from the fluid control units, a casing to accommodate therein the fluid control units and the electric circuit board, and an apparatus-side connector interposed between the electric circuit board and a cable electrically connected thereto. The fluid control apparatus further includes a connector board configured to mount thereon the apparatus-side connector. The connector board is secured to the electric circuit board with at least a part of the connector board in surface contact
(Continued)

with the electric circuit board, or overlapping the electric circuit board with a clearance therebetween.

7 Claims, 7 Drawing Sheets

(51) Int. Cl.
 *H01R 12/73* (2011.01)
 *H05K 1/11* (2006.01)
(52) U.S. Cl.
 CPC .............. *H05K 2201/10189* (2013.01); *H05K 2201/10287* (2013.01); *Y02P 70/611* (2015.11)

FLUID CONTROL APPARATUS

FIELD OF THE INVENTION

The present invention relates to a fluid control apparatus configured to measure and control a fluid, such as a material gas for use in a semiconductor process.

BACKGROUND ART

For example, a mass flow controller that is this type of fluid control apparatus includes fluid control units, such as a flow rate sensor and a flow rate control valve, an electric circuit board to send and receive a signal to and from these fluid control units, and a casing to accommodate therein the fluid control units and the electric circuit board, as disclosed in Patent Document 1. The mass flow controller is configured to be connected with a cable to, for example, a user-side information processor via a connector disposed on the electric circuit board.

Recently, thinning of the fluid control apparatus, such as the mass flow controller, is desired for reducing an installation area. Hence, for example, the present inventors have been developing a mass flow controller having an extremely small dimension in a width direction that is a direction orthogonal to a face plate part of the casing.

Owing to the development of the above mass flow controller, a plurality of the mass flow controllers adjacent to each other can be disposed closely adjacent to each other without any clearance therebetween by disposing the mass flow controllers so that the face plates of the casings are opposed to each other. This makes it possible to configure an extremely compact fluid control system.

In order to manufacture a mass flow controller having an extremely small width direction dimension, it is necessary to minimize an clearance between an inner surface of the casing and various types of electronic components, the fluid control units, or the like to be mounted on the electric circuit board, while avoiding any interference therebetween.

Accordingly, for example, arrangement of the electric circuit board and the fluid control units in the width direction of the casing is determined to some extent, so that, for example, the electronic circuit board is disposed at a position shifted from a middle part in a width direction of the casing toward one face plate part or the other. Consequently, a connector mounted on the electric circuit board is disposed shiftedly from the middle part in the width direction of the casing toward one face plate part or the other.

Thus, when the connector is disposed shiftedly from the middle part in the width direction of the casing, a cable-side connector to be connected to the connector is not accommodated within the width of the casing but protrudes beyond the casing. This can cause the following problems. That is, for example, when taking out one of the mass flow controllers disposed adjacent to each other without any clearance therebetween, or when adjacently disposing other mass flow controller between two mass flow controllers, ease of work can become very low when an operation is carried out while the cables are in place, and working efficiency can become very low when the operation is carried out while attaching and detaching the cables one by one.

PRIOR ART DOCUMENT

Patent Document

Patent Document 1: Japanese Unexamined Patent Publication No. 2016-21219

SUMMARY OF THE INVENTION

Problems to be Solved by the Invention

Accordingly, the present invention has been made to solve the above problems and has for its main object to provide a fluid control apparatus making it possible to carry out cable connection without causing any deterioration in ease of work and working efficiency even when a plurality of the fluid control apparatuses are disposed adjacent to each other.

Means of Solving the Problems

A fluid control apparatus according to the present invention includes a fluid control unit configured to measure a flow rate or pressure of a fluid, a circuit board configured to send and receive a signal to and from the fluid control unit, a casing configured to accommodate therein the fluid control unit and the circuit board, and an apparatus-side connector configured to accept connection from a cable. The fluid control apparatus further includes, besides the circuit board, a connector board configured to mount thereon the apparatus-side connector. The connector board is secured to the circuit board in a state in which at least a part of the connector board is overlapped with the circuit board.

With the above fluid control apparatus, the connector board is secured to the circuit board in a surface contact state or an overlapped state with a clearance therebetween. Therefore, the connector board and the circuit board can be disposed shiftedly in a thickness direction, namely, in a width direction of the casing. Hence, regardless of the layout of the circuit board, the apparatus-side connector mounted on the connector board can be disposed at a middle part in the width direction of the casing or in the vicinity of the middle part, and the cable-side connector to be connected to the apparatus-side connector can be accommodated within the width of the casing. This makes it possible to perform the cable connection without deteriorating ease of work and working efficiency during attachment and detachment of the fluid control apparatus, even when the fluid control apparatuses of the present invention are disposed adjacent to each other in the width direction.

In order that the width direction dimension of the fluid control apparatus is kept small by minimizing an clearance between a rear surface of the mount surface in the connector board and an inner surface of the casing, there are, for example, such a structure that the surface of the connector board which is opposed to the circuit board is the mount surface configured to mount the apparatus-side connector thereon, and such a structure that an electronic component is mounted on the mount surface of the connector board.

In order to further reduce the width direction dimension of the fluid control apparatus, the connector board is preferably in surface contact with the circuit board.

When the apparatus-side connector protrudes beyond the casing in a height direction, the height direction dimension of the fluid control apparatus increases accordingly.

Preferably, the circuit board includes a notch part configured to dispose at least a part of the apparatus-side connector, and the connector board is preferably disposed so as to cover the notch part.

With this configuration, by disposing at least a part of the apparatus-side connector at the notch part, it is possible to eliminate or reduce a part of the apparatus-side connector which protrudes beyond the casing, thereby reducing the height direction dimension of the fluid control apparatus.

Preferably, one of the circuit board and the connector board includes an end-surface through hole disposed at a position along an outer peripheral part of one of the circuit board and the connector board, the one is overlapped with another at the position, and the another includes a connection terminal part disposed at a position corresponding to the end-surface through hole.

With this configuration, for example, by soldering the end-surface through hole and the connection end part together, it is possible to secure and electrically connect the connector board to the circuit board, and it is also possible to proceed an operation while checking whether the end-surface through hole and the connection terminal part are surely soldered together.

As an embodiment that more remarkably produces the effect of the present invention, for example, a width dimension of the casing is 10 mm or less.

Alternatively, a fluid control apparatus according to the present invention includes a fluid control unit configured to measure a flow rate or pressure of a fluid, a circuit board configured to send and receive a signal to and from the fluid control unit, a casing configured to accommodate therein the fluid control unit and the circuit board, and an apparatus-side connector configured to accept connection from a cable. The fluid control apparatus further includes, besides the circuit board, a connector board configured to mount thereon the apparatus-side connector. The connector board is disposed in the casing so that a cable-side connector being connected to the apparatus-side connector can be accommodated within a width of the casing.

With the above fluid control apparatus, the cable-side connector is configured to be accommodated within the width of the casing. Therefore, even when the fluid control apparatuses are disposed adjacent to each other in the width direction, it is possible to effortlessly connect the cable to each of the fluid control apparatuses.

Effects of the Invention

According to the present invention so configured, even when the fluid control apparatuses are disposed adjacent to each other, it is possible to effortlessly connect the cable to each of the fluid control apparatuses.

DESCRIPTION OF THE EMBODIMENTS

An embodiment of a fluid control apparatus according to the present invention is described below with reference to the drawings.

Figure 1:
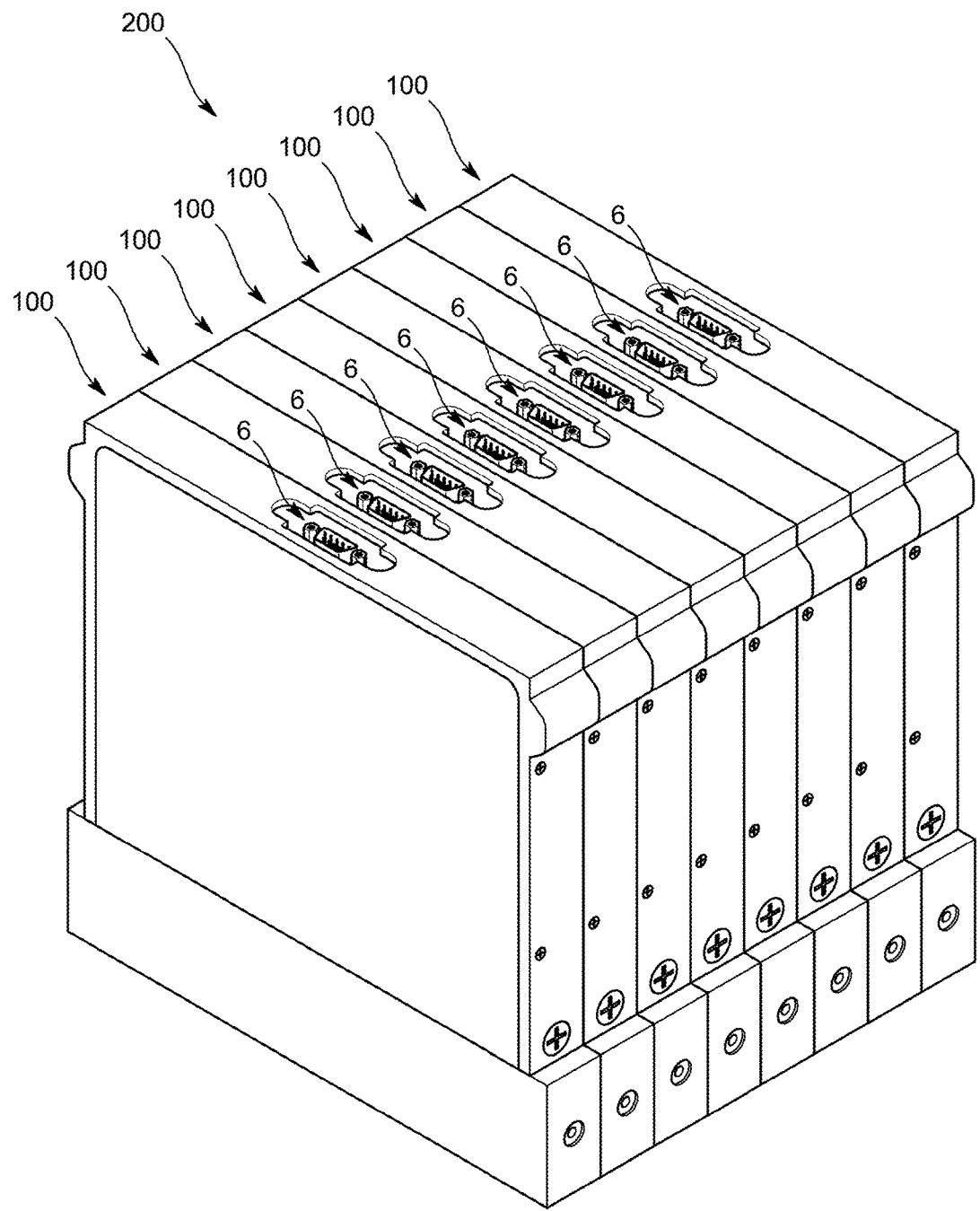
FIG. 1 is a diagram that schematically shows a general configuration of a fluid control system of the present embodiment.

As shown in FIG. 1, the fluid control apparatuses 100 of the present embodiment constitute a fluid control system 200 for use in, for example, a semiconductor manufacturing process using a plurality of gases, and are respectively disposed on a plurality of gas lines so as to independently control physical properties of fluids passing through the gas lines, such as a flow rate, pressure, temperature, and viscosity.

Figure 2:
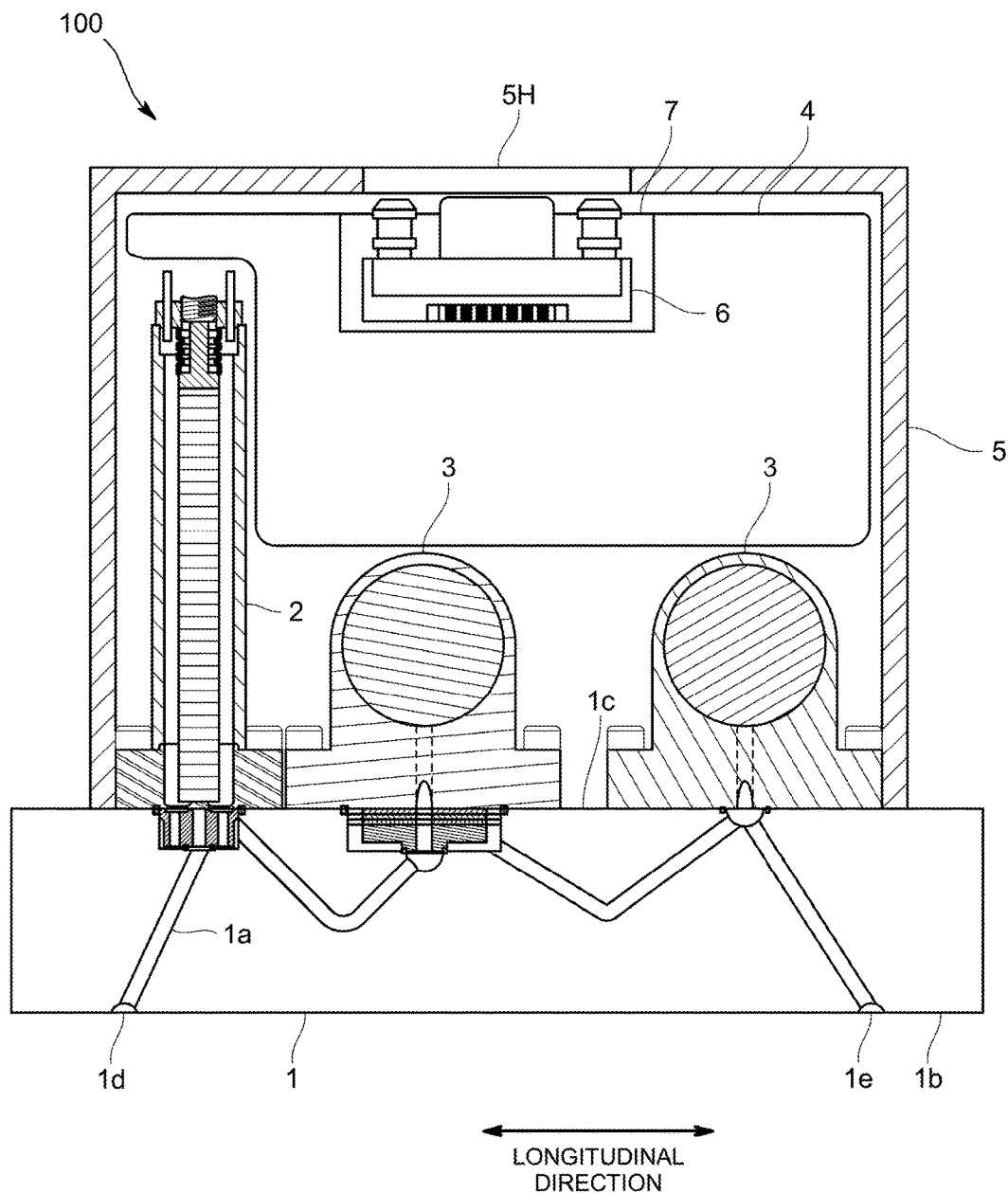
FIG. 2 is a diagram that schematically shows a configuration of a fluid control apparatus of the embodiment.

To be specific, as shown in FIG. 2, the fluid control apparatus 100 includes a body 1, a flow rate control valve 2, a pressure sensor 3, an electric circuit board 4, and a casing 5. The body 1 includes an internal flow channel 1a configured to pass a fluid therethrough. The flow rate control valve 2 is fluid equipment disposed on the internal flow channel 1a. The pressure sensor 3 is fluid equipment disposed downstream of the flow rate control valve 2 and is configured to measure a mass flow rate of a fluid passing through the internal flow channel 1a. The electric circuit board 4 (hereinafter also referred to as "a main board 4") is configured to send and receive a signal to and from the flow rate control valve 2 and the pressure sensor 3. The casing 5 is configured to accommodate therein the flow rate control valve 2, the pressure sensor 3, and the main board 4.

The body 1 is made of, for example, metal in the form of a narrow elongated rectangular parallelepiped as shown in FIG. 2. One surface of the body 1 which is parallel to a longitudinal direction thereof serves as a component attachment surface 1c, and components, such as the flow rate control valve 2 and the pressure sensor 3, are attachable to the component attachment surface 1c. A surface on the opposite side from the attachment surface 1c serves as a fixing surface 1b for fixing the body 1 to a panel or the like. In the present embodiment, an input port 1d of the internal flow channel 1a is communicated with one end portion of the fixing surface 1b in a longitudinal direction thereof, and an output port 1e of the internal flow channel 1a is communicated with the other end portion. It is configured so that nothing is attached to other two surfaces parallel to the longitudinal direction (hereinafter referred to as "side surfaces"), thereby making it possible to dispose the fluid control apparatuses 100 so that the side surfaces of their respective bodies 1 are disposed closely adjacently to each other.

The internal flow channel 1a extends between one end portion of the body 1 and the other end portion in the longitudinal direction, and is configured so that a fluid flows approximately in parallel to the longitudinal direction when viewed from a plane direction that is a direction vertical to the component attachment surface 1c. Hereinafter, the direction vertical to the longitudinal direction when viewed from the plane direction is referred to as "a width direction."

The flow rate control valve 2 has a columnar shape and is vertically attached to the component attachment surface 1c. A maximum width dimension of the flow rate control valve 2 is set to be smaller than or equal to a width dimension (dimension in a direction orthogonal to the longitudinal direction) of the component attachment surface 1c. The flow rate control valve 2 is configured so as not protrude beyond the body 1 in the width direction in a state in which the flow rate control valve 2 is attached to the body 1.

The pressure sensor 3 has a flat shape and is attached to the component attachment surface 1c so that the face plate part (flat surface) is approximately vertical to the component attachment surface 1c and is approximately parallel to the longitudinal direction of the body 1, namely, approximately parallel to a fluid flow direction in a plan view. A thickness dimension of the pressure sensor 3 is set to be smaller than or equal to the width direction dimension of the component attachment surface 1c so that the pressure sensor 3 in its attached state does not protrude beyond the body 1 in the width direction.

The main board 4 is fixed to the casing 5 by a screw or the like in an upright position approximately vertical to the component attachment surface 1c. Specifically, the main board 4 includes a sheet member having thereon digital circuits, such as a CPU, memory, and a communication circuit, and analog circuits, such as an amplifier and buffer. According to a program stored in the memory, the CPU and other peripheral units cooperate with each other to calculate a flow rate of a fluid passing through the internal flow channel 1a on the basis of a measured pressure obtained by the pressure sensor 3, and also control the flow rate control valve 2 so that the measured flow rate reaches a predetermined target flow rate.

Figure 3:
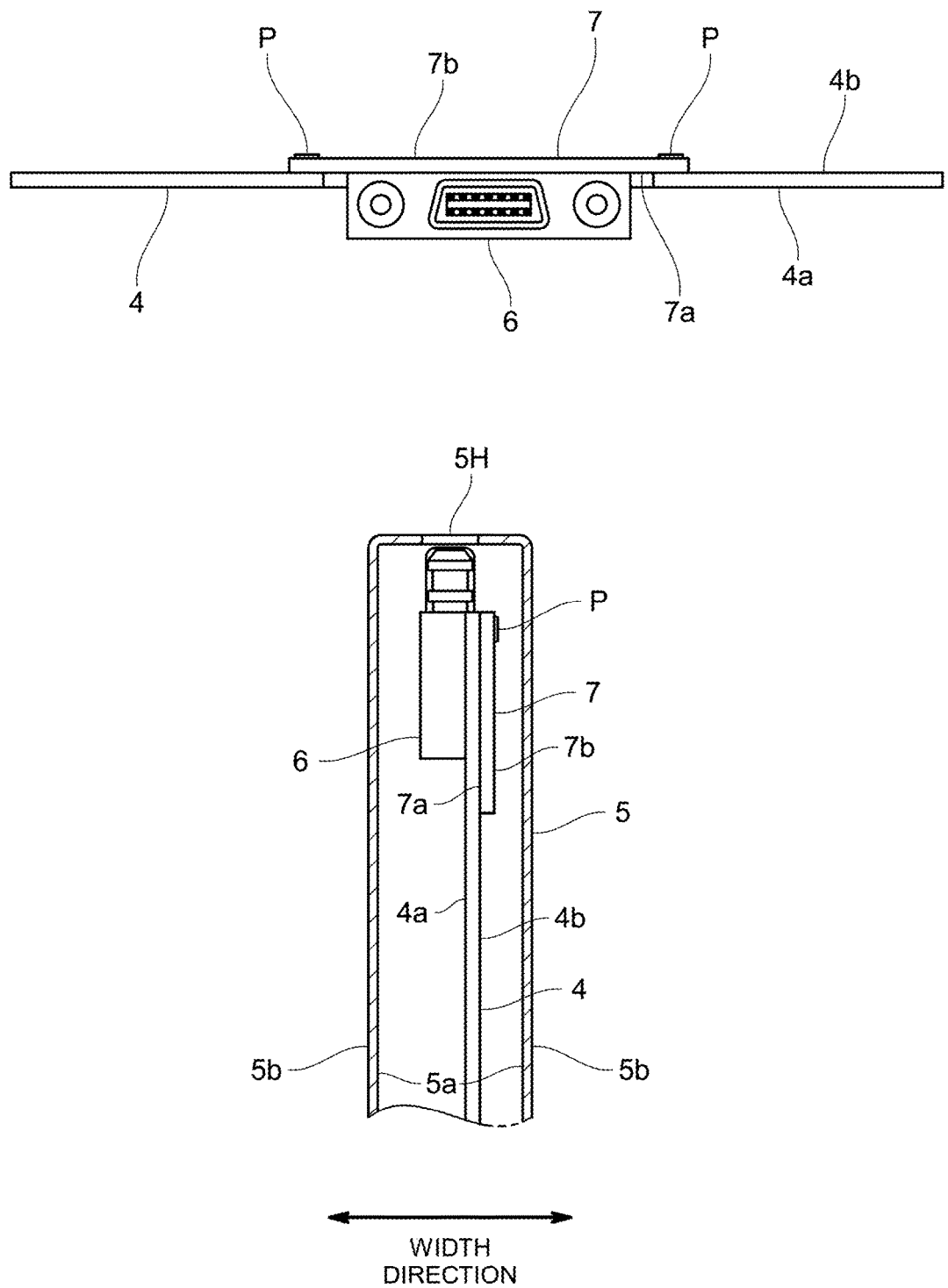
FIG. 3 is a diagram that schematically shows a configuration of a connector board in the embodiment.

The main board 4 of the present embodiment includes the sheet member having a thickness dimension of approximately 1 mm and has the following arrangement. That is, as shown in FIG. 3, a clearance between a surface 4a (hereinafter also referred to as "a front surface 4a") mainly provided with the digital circuit and the analog circuit and an inner surface 5a of the casing 5 is larger than a clearance between a surface 4b (hereinafter also referred to as "a rear surface 4b") on the opposite side from the front surface 4a and the inner surface 5a of the casing 5.

A width dimension of the casing 5 (a distance from one outer surface 5b of the single fluid control apparatus 100 to the other outer surface 5b) is set to be approximately equal to a width dimension of the body 1. Here, the casing 5 has such a rectangular parallelepiped shape that the width dimension is 10 mm.

The fluid control apparatuses 100 so configured constitute the fluid control system 200 by being adjacently disposed in the width direction as shown in FIG. 1. These fluid control apparatuses 100 are configured to establish a cable connection with the user-side information processor in order to communicate various information, for example, between an external user-side information processor and each of the fluid control apparatuses 100.

More specifically, in each of the fluid control apparatuses 100, a cable insertion port 5H is formed on the upper surface of the casing 5 and is configured so that a connector of a cable (not shown) (hereinafter also referred to as "a cable-side connector) is connectable to a connector 6 disposed below the cable insertion port 5H (hereinafter referred to as "an apparatus-side connector 6"). The cable-side connector and the apparatus-side connector 6 are communication connectors having a predetermined standard.

In a semiconductor manufacturing line or the like for which the fluid control apparatuses 100 are used, a limitation is particularly imposed on a height direction in installation space of the fluid control apparatuses. Therefore, in order to prevent interference of the cables above the fluid control apparatuses 100, an L-shaped connector is often used as the cable-side connector. It is assumed that the cable-side connector as being the L-shaped connector is also connected to the apparatus-side connector 6 of the present embodiment.

Figure 4:
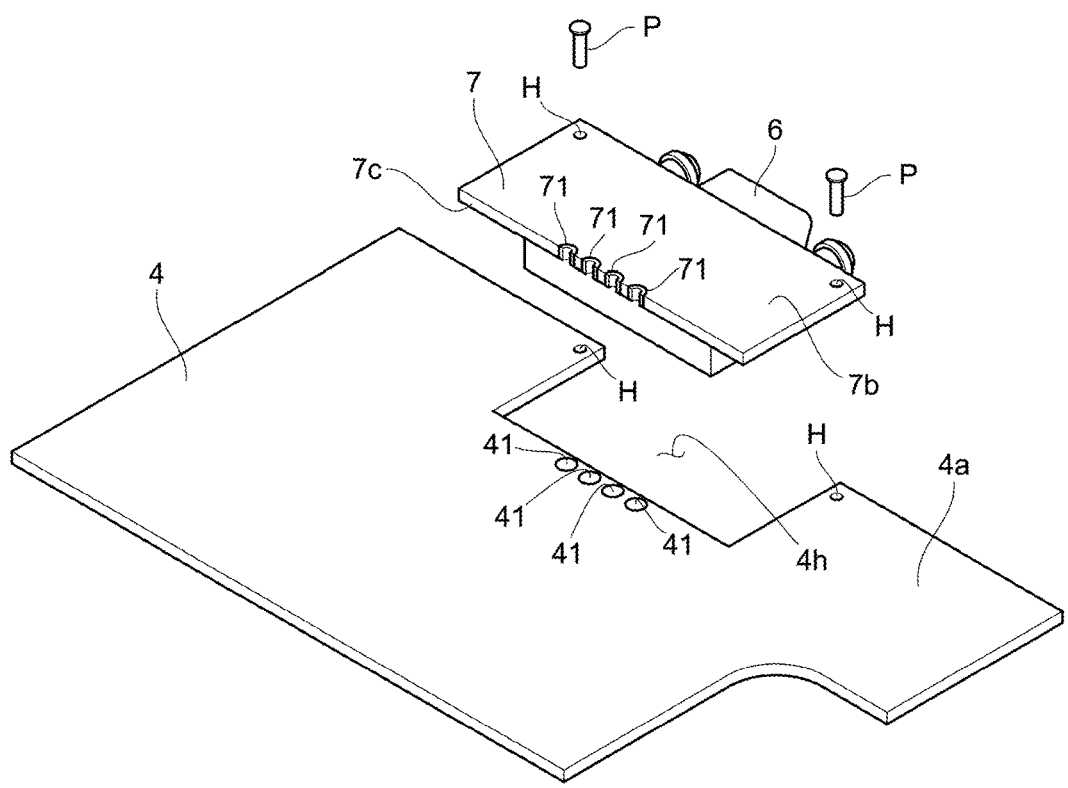
FIG. 4 is a diagram that schematically shows a configuration between the connector board and a main board in the embodiment.
Figure 4:
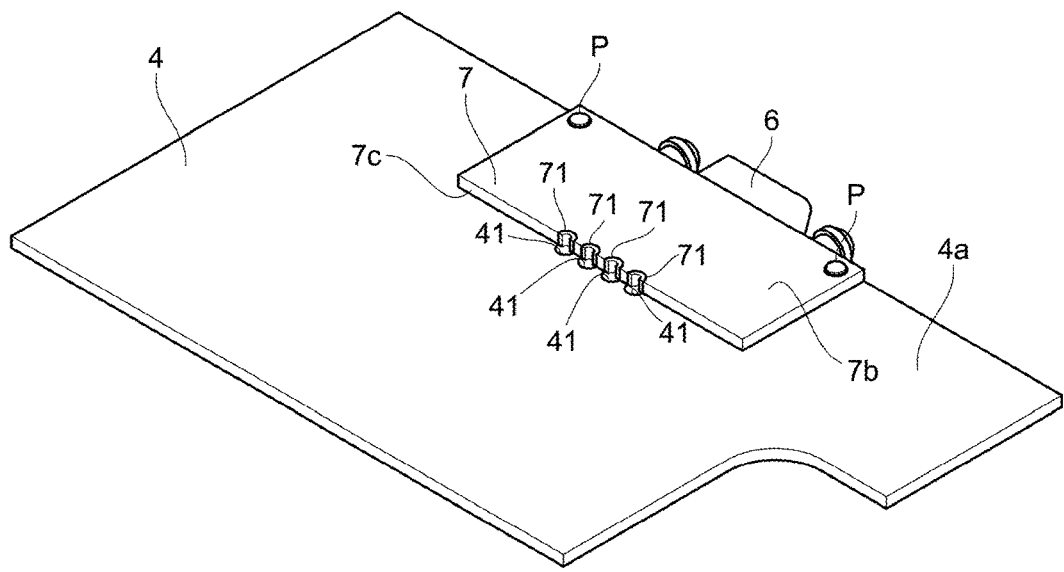

The fluid control apparatus 100 of the present embodiment further includes a connector board 7 having the apparatus-side connector 6 mounted thereon as shown in FIGS. 3 and 4.

The connector board 7 is a separate body from the main board 4, and the apparatus-side connector 6 is electrically connected and secured to the connector board 7 as shown in FIG. 3. Specifically, the connector board 7 has, for example, a rectangular flat plate shape, and a thickness dimension of a sheet member thereof has the same thickness dimension (approximately 1 mm in this case). Here, the apparatus-side connector 6 is mounted on one surface 7a of the connector board 7 (hereinafter also referred to as "a mount surface 7a"), and other electronic components are mounted only on the mount surface 7a, whereas no electronic component is mounted on the other surface 7b (the surface on the opposite side from the mount surface 7a).

The connector board 7 is secured shiftedly in the width detection (the thickness direction of the board) to the main board 4, and is electrically connected to the main board 4. A part of the connector board 7 is secured to the main board 4 in an overlapped state in order to reduce the width dimension of the fluid control apparatus 100 as much as possible. The term "overlapped state" denotes a state in which the main board 4 and the connector board 7 are overlapped with each other in a plan view, and includes not only a state in which the main board 4 and the connector board 7 are contacted with each other, but a state in which a clearance is held between the main board 4 and the connector board 7.

In the present embodiment, the connector board 7 is secured to the main board 4 in a state in which the mount surface 7a is opposed to the rear surface 4b of the main board 4 and these surfaces are contacted with each other as shown in FIGS. 3 and 4.

With the above configuration, the mount surface 7a of the connector board 7 is shifted from the front surface 4a of the main board 4 toward the rear surface 4b of the main board 4 by an amount of the thickness dimension of the main board 4 (approximately 1 mm in this case). This makes it possible to dispose the apparatus-side connector 6 at a position shifted toward the rear surface 4b of the main board 4 by the amount of the thickness dimension of the main board 4 (approximately 1 mm in this case) compared to the case of mounting the apparatus-side connector 6 on the front surface 4a of the main board 4.

The connector board 7 and the main board 4 are not necessarily required to be brought into surface contact with each other. For example, a spacer with a predetermined thickness dimension may be interposed between these two boards. In this case, the apparatus-side connector 6 is disposed at a position shifted toward the rear surface 4b of the main board 4 by a total of the thickness dimension of the main board 4 and the thickness dimension of the spacer, compared to the case of mounting the apparatus-side connector 6 on the front surface 4a of the main board 4.

The connector board 7 of the present embodiment is provided with a notch part 4h at which at least a part of the apparatus-side connector 6 is disposed as shown in FIG. 4. The connector board 7 is secured to the main board 4 so that the notch part 4h is covered with the connector board 7. In other words, the notch part 4h is made into such a size that the entirety of the notch part 4h is covered with the connector board 7, and has, for example, a rectangular shape smaller than the connector board 7.

The shape of the notch part 4h is not limited to the rectangular shape, but may be suitably changed, such as a shape along a contour of the apparatus-side connector 6. Alternatively, an existing one free from the notch part 4h may be used as the connector board 7.

The securing and electrical connection of the connector board 7 to the main board 4 are described below.

A through hole H is formed at a corresponding position in each of the main board 4 and the connector board 7 as shown in FIG. 4. Firstly, the connector board 7 is positioned into the main board 4 by inserting a positioning pin P for surface mount into the through hole H, followed by soldering.

Subsequently, the main board 4 and the connector board 7 are electrically connected to each other by, for example, soldering.

Here, as shown in FIG. 4, the connector board 7 has a plurality of end-surface through holes 71 disposed at positions along an outer peripheral part of the connector board 7 at which the connector board 7 is overlapped with the main board 4. The main board 4 has a plurality of connection terminal parts 41 disposed at positions respectively corresponding to the end-surface through holes 71. In a state in which the connector board 7 is positioned, the end-surface through holes 71 are respectively electrically connected to the connection terminal parts 41.

Each of the end-surface through holes 71 extends between the mount surface 7*a* and the rear surface 7*b* on one side part (a long side part in this case) of the connector board 7, and a part of a side surface of the connector board 7 is, for example, a semi-cylindrical-shaped conductive one that serves as an inner surface of the end-surface through hole 71.

The connection terminal parts 41 are, for example, thin-plate circular-shaped conductive ones disposed at positions on the main board 4 at which the outer peripheral part of the connector board 4 are overlapped with the main board 4.

With the above configuration, the connector board 7 can be electrically connected and secured to the main board 4 by soldering the end-surface through holes 71 and the connection terminal parts 41 together in a state in which the connector board 7 is positioned into the main board 4.

Figure 5:
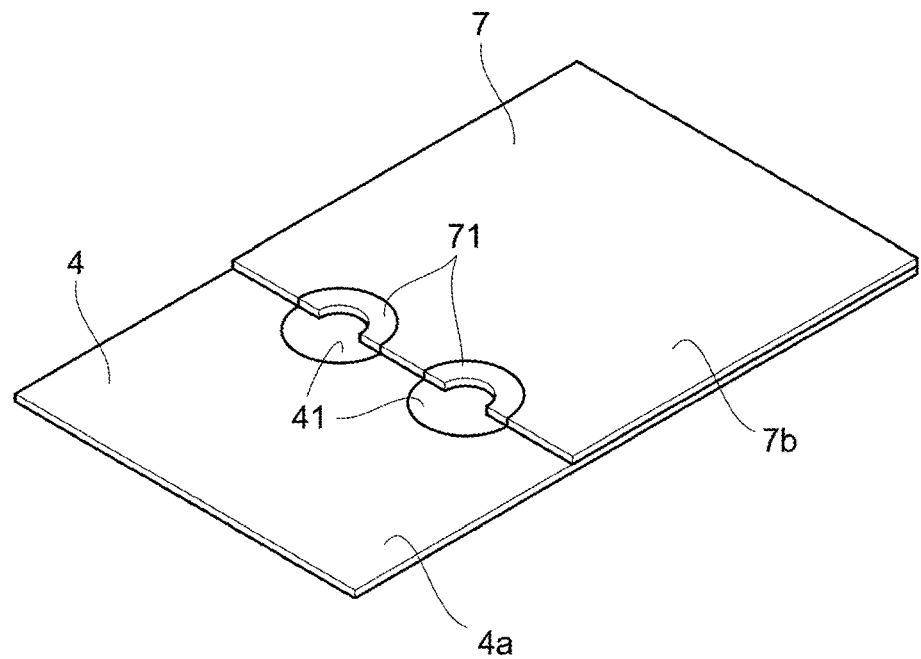
FIG. 5 is a diagram that schematically shows an end-surface through hole in the embodiment.
Figure 5:
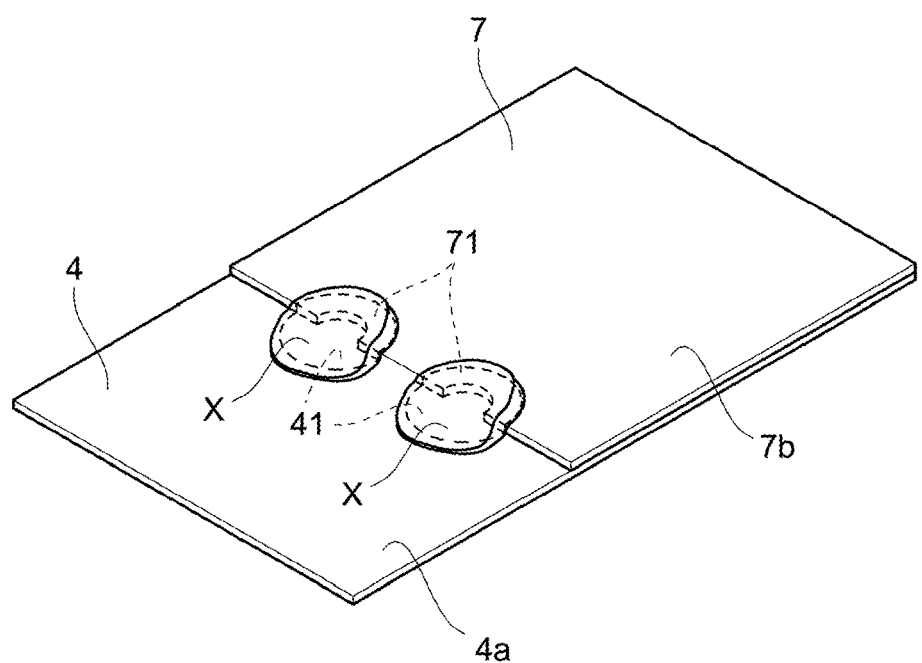

Thus, by soldering the main board 4 and the connector board 7 together with the use of the end-surface through holes 71, it is possible to proceed an operation while checking whether solder enters the end-surface through holes 71 and the connection terminal parts 41 as shown in FIG. 5. This leads to surer soldering than the case of pouring the solder into columnar through holes.

With the fluid control apparatus 100 of the present embodiment so configured, the connector board 7 is overlapped with and secured to the main board 4, and it is therefore possible to shift the position of the apparatus-side connector 6 toward the rear surface 4*b* of the main board 4 by the amount of the thickness dimension of the main board 4, compared to the case of mounting the apparatus-side connector 6 on the front surface 4*a* of the main board 4.

Accordingly, without changing the layout of the main board 4 in the casing 5, the apparatus-side connector 6 can be disposed at a middle part in the width direction of the casing 5 or in the vicinity of the middle part, and therefore the cable-side connector to be connected to the apparatus-side connector 6 can be accommodated within the width dimension of the casing 5.

Consequently, for example, when taking out one of the fluid control apparatuses 100 disposed adjacent to each other in the width direction, and when adjacently disposing other fluid control apparatus 100 between two fluid control apparatuses 100, the deterioration in ease of work and working efficiency is preventable without being obstructed by the cables connected to the fluid control apparatuses 100.

Additionally, because no electronic component is mounted on the surface 7*b* on the opposite side from the mount surface 7*a* of the connector board 7, the clearance between the surface 7*b* on the opposite side and the inner surface 5*a* of the casing 5 can be reduced as much as possible, and the width direction dimension of the fluid control apparatus 100 can be kept small.

Furthermore, because the main board 4 is provided with the notch part 4*h* configured to accommodate therein the part of the apparatus-side connector 6, it is possible to eliminate or reduce a part of the apparatus-side connector 6 which protrudes beyond the upper surface of the casing 5, thereby reducing the height direction dimension of the fluid control apparatus 100.

It is to be understood that the present invention is not limited to the above embodiment.

For example, though the main board and the connector board are soldered together with the use of the end-surface through holes and the connection terminal parts in the above embodiment, the main board and the connector board may be electrically connected to each other with a connection pin for surface mount interposed therebetween.

Figure 6:
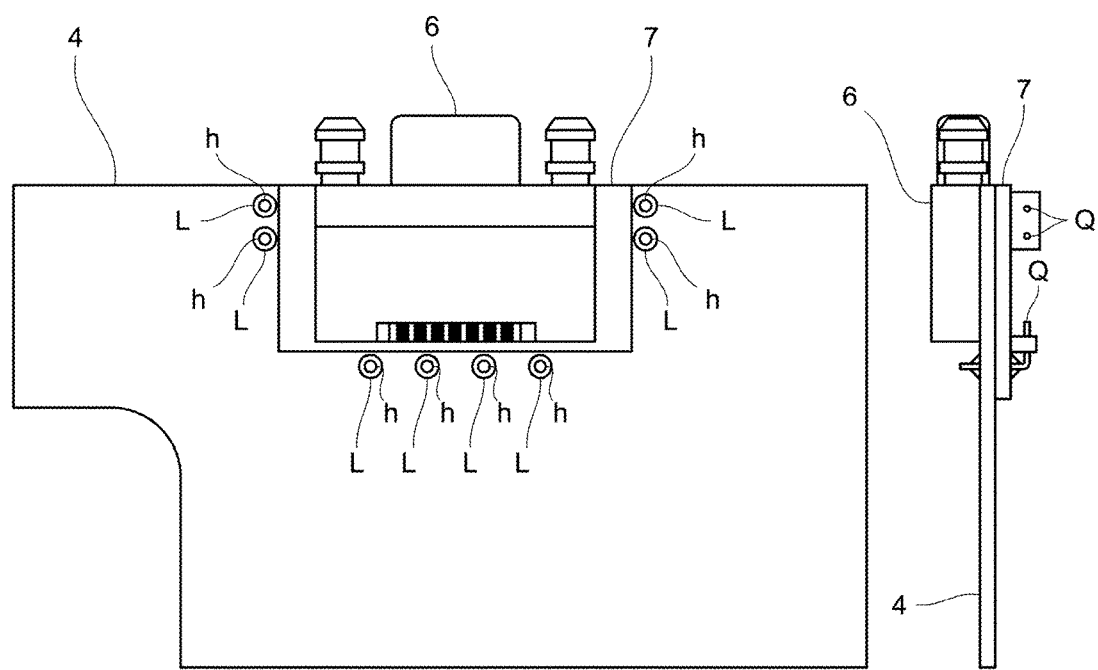
FIG. 6 is a diagram that schematically shows a configuration between a connector board and a main board in a modified embodiment.

As a specific embodiment, there is such a configuration that a plurality of through holes h (for example, drilled holes) are formed at corresponding positions on the main board and the connector board, and ring-shaped lands L are respectively disposed around these through holes h as shown in FIG. 6. With this configuration, the main board 4 and the connector board 7 can be electrically connected to each other by soldering the lands L and the connection pins Q in a state in which the connection pins Q are respectively inserted into the through holes h. In order to efficiently carry out the soldering, it is preferable to use, as the connection pins Q, bent ones, such as right-angle pin headers.

Although the mount surface 7*a* of the connector board 7 is in contact with the rear surface 4*b* of the main board 4 in the above embodiment, the surface of the connector board 7 on the opposite side from the mount surface 7*a* may be in contact with the front surface of the main board 4.

With this configuration, the mount surface 7*a* of the connector board 7 can be shifted from the front surface 4*a* of the main board 4 further toward the front surface 4*a* of the main board 4 by an amount of the thickness dimension of the connector board 7.

Although the connector board has the end-surface through holes and the main board has the connection terminal parts in the above embodiment, the main board may have the end-surface through holes, and the connector board may have the connection terminal parts.

Although the end-surface through holes are disposed on the single side part along the outer peripheral part of the connector board in the above embodiment, the end-surface through holes may be disposed on a plurality of side parts.

Figure 7:
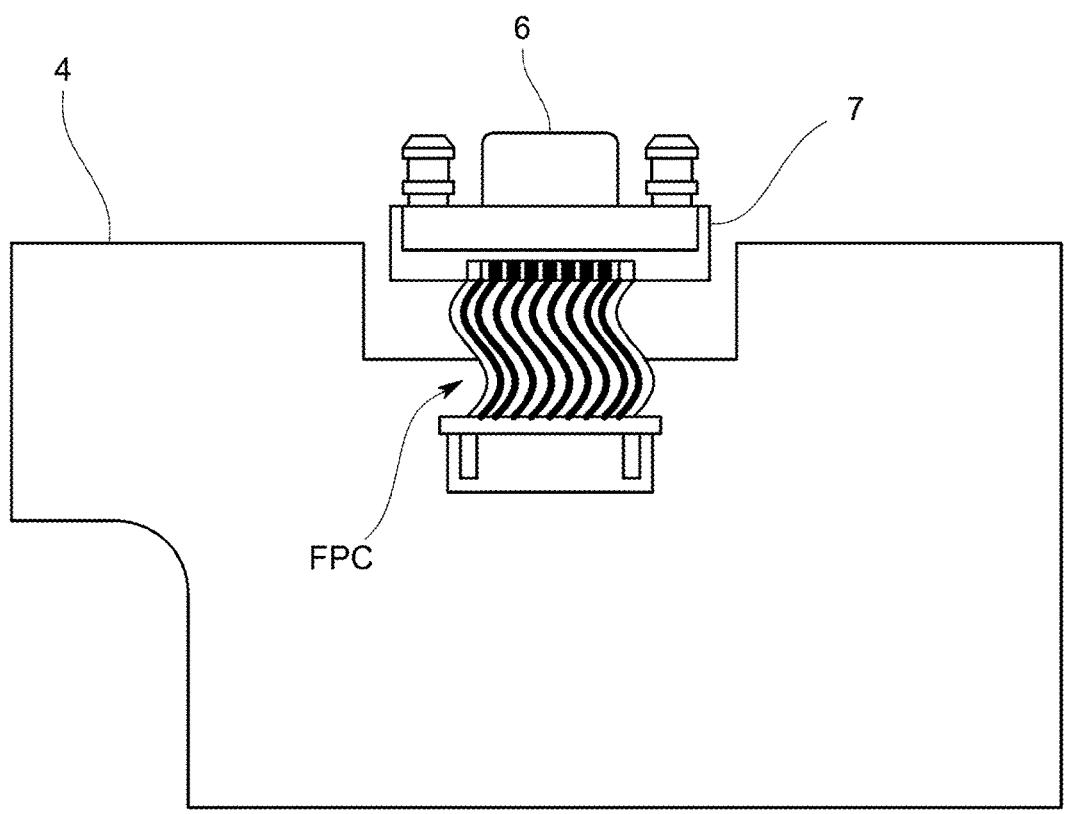
FIG. 7 is a diagram that describes the connector board in the modified embodiment.

As shown in FIG. 7, the connector board 7 is not necessarily required to be secured to the main board 4, but may be electrically connected to the main board 4 with, for example, a flexible printed circuit FPC interposed therebetween.

More specifically, the connector board 7 needs to be disposed in the casing 5 so that a cable-side connector (not shown) being connected to the apparatus-side connector 6 can be accommodated within the width of casing 5, and in this state, the connector board 7 needs to be secured to the upper surface of the casing 5 by using, for example, a screw.

With the above configuration, when the fluid control apparatuses 100 are disposed adjacent to each other in the width direction, the cable-side connectors being connected to the apparatus-side connectors 6 of the fluid control apparatuses 100 adjacent to each other do not interfere with each other. It is therefore possible to effortlessly connect the cable to each of the fluid control apparatuses 100.

Additionally, the connection between the main board and the connector board, and the connection between the fluid control apparatus and the external information processor are not limited to electrical connection, but these connections may be, for example, optical connections.

As for the rest, it should be noted that the present invention is not limited to the above-described embodiment. Nevertheless, it will be understood that various modifications may be made without departing from the spirit and scope of the present invention.

DESCRIPTION OF REFERENCE CHARACTERS 100 fluid control apparatus
4 main board (electric circuit board)
5 casing
6 apparatus-side connector
7 connector board
71 end-surface through hole
7a mount surface

What is claimed is:

1. A fluid control apparatus, comprising:
a fluid control unit configured to measure a flow rate or pressure of a fluid;
a circuit board configured to send and receive a signal to and from the fluid control unit;
a casing configured to accommodate therein the fluid control unit and the circuit board; and
an apparatus-side connector configured to accept connection from a cable,
wherein the fluid control apparatus further comprises, besides the circuit board, a connector board configured to mount thereon the apparatus-side connector,
wherein the connector board is secured to the circuit board in a state in which at least a part of the connector board is overlapped with the circuit board,
wherein the circuit board comprises a notch part configured to dispose at least a part of the apparatus-side connector, and
wherein the connector board is disposed so as to cover the notch part.

2. The fluid control apparatus according to claim 1, wherein a surface of the connector board opposed to the circuit board is a mount surface configured to mount thereon the apparatus-side connector.

3. The fluid control apparatus according to claim 2, wherein an electronic component is mounted on the mount surface of the connector board.

4. The fluid control apparatus according to claim 1, wherein the connector board is in surface contact with the circuit board.

5. The fluid control apparatus according to claim 1, wherein a width dimension of the casing is 10 mm or less.

6. A fluid control apparatus, comprising:
a fluid control unit configured to measure a flow rate or pressure of a fluid;
a circuit board configured to send and receive a signal to and from the fluid control unit;
a casing configured to accommodate therein the fluid control unit and the circuit board; and
an apparatus-side connector configured to accept connection from a cable,
wherein the fluid control apparatus further comprises, besides the circuit board, a connector board configured to mount thereon the apparatus-side connector,
wherein the connector board is secured to the circuit board in a state in which at least a part of the connector board is overlapped with the circuit board,
wherein one of the circuit board and the connector board comprises an end-surface through hole disposed at a position along an outer peripheral part of one of the circuit board and the connector board, and the one is overlapped with another at the position, and
wherein the another of the circuit board and the connector board comprises a connection terminal part disposed at a position corresponding to the end-surface through hole.

7. A fluid control apparatus, comprising:
a fluid control unit configured to measure a flow rate or pressure of a fluid;
a circuit board configured to send and receive a signal to and from the fluid control unit;
a casing configured to accommodate therein the fluid control unit and the circuit board; and
an apparatus-side connector configured to accept connection from a cable,
wherein the fluid control apparatus further comprises, besides the circuit board, a connector board configured to mount thereon the apparatus-side connector,
wherein the connector board is disposed in the casing so that a cable-side connector being connected to the apparatus-side connector is accommodated within a width of the casing,
wherein the circuit board comprises a notch part configured to dispose at least a part of the apparatus-side connector, and
wherein the connector board is disposed so as to cover the notch part.

* * * * *